United States Patent [19]

Kobayashi et al.

[11] Patent Number: 4,912,425
[45] Date of Patent: Mar. 27, 1990

[54] OPERATIONAL AMPLIFIER CIRCUIT HAVING STABLE OPERATING POINT

[75] Inventors: Osamu Kobayashi, Yokohama; Kunihiko Gotoh, Tama, both of Japan

[73] Assignee: Fujitsu Limited, Kawasaki, Japan

[21] Appl. No.: 275,311

[22] Filed: Nov. 23, 1988

[30] Foreign Application Priority Data

Nov. 25, 1987 [JP] Japan .................. 62-295326

[51] Int. Cl.$^4$ .................... H03F 3/45; H03F 3/26
[52] U.S. Cl. .................... 330/253; 330/255; 330/264
[58] Field of Search ............ 330/252, 253, 255, 261, 330/263, 264, 267, 277, 311

[56] References Cited

U.S. PATENT DOCUMENTS 4,284,957 8/1981 Haque .................. 330/255 X
4,656,435 4/1987 Czarniak et al. .......... 330/255 X

FOREIGN PATENT DOCUMENTS 59-156012 9/1984 Japan .

Primary Examiner—Steven Mottola
Attorney, Agent, or Firm—Armstrong, Nikaido, Marmelstein, Kubovcik & Murray

[57] ABSTRACT

An operational amplifier circuit comprises a differential amplifier circuit for generating an output voltage in response to the difference in potential between two input signals, a level shift circuit for shifting the output voltage of the differential amplifier circuit, a push-pull output circuit which operates in response to the output voltages of the differential amplifier circuit and the level shift circuit, and a bias circuit for generating a bias voltage in response to a power supply voltage to control the level shift circuit. The output voltage of the level shift circuit is not affected by fluctuations of the power supply voltage.

10 Claims, 11 Drawing Sheets

| $\Delta V_{DD}$ | $\Delta V_2'$ | $\Delta V_B$ | $\Delta V_2$ | $\Delta I_{T5}$ | $\Delta V_3$ |
|---|---|---|---|---|---|
| ↗ | ↗ | ↗ | ↘ | ↙ | ↑ |
| ↗ | ↗ | ↗ | ↗ | ↗ | ↑ |
| $\Delta V_{DD}$ | $\Delta V_{DD}$ | $\dfrac{g_{m5}'}{g_{m5}'+g_{m8}'}\Delta V_{DD}$ | $\Delta V_{DD}$ | $\dfrac{g_{m5}'\cdot g_{m8}'}{g_{m5}'-g_{m8}'}\Delta V_{DD}$ | 0 |

| $\Delta V_{DD}$ | $\Delta V_2'$ | $\Delta V_B$ | $\Delta V_2$ | $\Delta I_{T5}$ | $\Delta V_3$ |
|---|---|---|---|---|---|
| ↙ | ↙ | ↖ | ↙ | ↙ | ↑ |
| ↗ | ↗ | ↗ | ↗ | ↗ | ↑ |
| $\Delta V_{DD}$ | $\Delta V_{DD}$ | $\Delta V_{DD}$ | $\Delta V_{DD}$ | $g_{m8} \cdot \Delta V_{DD}$ | 0 |

| $\Delta V_{DD}$ | $\Delta V_2'$ | $\Delta V_3'$ | $\Delta V_B$ | $\Delta V_{th\,T5}$ $\Delta V_{th\,T15}$ | $\Delta V_2$ | $\Delta V_3$ |
|---|---|---|---|---|---|---|
| ↗ | ↗ | ↘ | ↗ | ↘ | ↙ | ↑ |
| ↗ | ↗ | ↗ | ↗ | ↗ | ↗ | ↑ |
| $\Delta V_{DD}$ | $\Delta V_{DD}$ | DEPENDENT ON $T_5, T_{15}, T_{17}, I_6$ | DEPENDENT ON $T_5, T_{15}$ | $\Delta V_{DD}$ | $\Delta V_{DD}$ | 0 |

Fig. 9B

OPERATIONAL AMPLIFIER CIRCUIT HAVING STABLE OPERATING POINT

BACKGROUND OF THE INVENTION (1) Field of the Invention

The present invention relates to an operational amplifier circuit comprising a push-pull output stage having a stable operating point even when fluctuations occur in a power supply voltage.

(2) Description of the Related Art

An operational amplifier circuit is widely used for various analog operators. For example, a known prior art operational amplifier circuit comprises a differential amplifier circuit for generating an output voltage in response to a difference in potential between two input signals, a level shift circuit for shifting the output voltage of the differential amplifier circuit, and a push-pull output circuit which operates in response to the output voltages of the differential amplifier circuit and the level shift circuit (see: Japanese Unexamined Patent Publication (Kokai) No. 59-156012). In this prior art circuit, however, when fluctuations occur in a power supply voltage, fluctuations of the operating point of the operational amplifier circuit, i.e., the operating point of the push-pull output circuit, occur, thus increasing the fluctuation current, the fluctuation of the unity gain frequency characteristics, the fluctuation of the DC gain characteristics, and the like, which will be later explained in detail. This large fluctuation generated by the fluctuation of the power supply voltage is not advantageous in the design of operational amplifier circuits, since the scope of a design choice thereof is reduced thereby.

Therefore, an object of the present invention is to provide an operational amplifier circuit having a stable operating point, to thereby reduce the fluctuation of the current, the fluctuation of the unity gain frequency characteristics, the fluctuation of the DC gain characteristics, and the like.

According to the present invention, an operational amplifier circuit comprises a differential amplifier circuit for generating an output voltage in response to a difference in potential between two input signals, a level shift circuit for shifting the output voltage of the differential amplifier circuit, a push-pull output circuit which operates in response to the output voltages of the differential amplifier circuit and the level shift circuit, and a bias circuit for generating a bias voltage in response to a power supply voltage to control the level shift circuit. The output voltage of the level shift circuit is not affected fluctuations of the power supply voltage.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Before the description of the embodiments, a prior art operational amplifier circuit will be first explained with reference to FIG. 1 and FIG. 2, which is a detailed circuit diagram of FIG. 1 (See FIG. 4 of Japanese Unexamined Patent Publication No. 59-156012). In the Figures, reference numeral 1 designates a differential amplifier circuit for generating an output $V_2$ in accordance with a difference in potential between input signals $+IN$ and $-IN$, and this circuit 1 comprises P-channel transistors $T_1$ and $T_2$, N-channel transistors $T_3$ and $T_4$, and a constant current source $I_1$. Note that a common gate potential is applied to the gates of the P-channel transistors $T_1$ and $T_2$, thereby forming a current mirror circuit. Also, the N-channel transistors $T_3$ and $T_4$ are operated in a saturation state. For example, if $+IN > -IN$, a voltage $V_1$ is high and a voltage $V_2$ is low. Conversely, if $+IN < -IN$, the voltage $V_1$ is low and the voltage $V_2$ is high. In this case, the center of an amplitude of the signals $+IN$ and $-IN$ is at an intermediate level between two power supply voltages $V_{DD}$ and $V_{SS}$. Reference numeral 2 designates a level shift circuit for shifting down the output voltage $V_2$ of the differential amplifier circuit 1 by a predetermined voltage, and this circuit 2 comprises an N-channel transistor $T_5$ and a constant current source $I_2$. In this case, the difference between the output voltage $V_2$ of the differential amplifier circuit 1 and the output voltage $V_3$ of the level shift circuit 2 is determined by the threshold voltage of the N-channel transistor $T_5$, the characteristics $\beta$ of the transistor $T_5$, and the current of the constant current source $I_2$. Reference numeral 3 designated a push-pull output circuit which is composed of a series circuit formed by a P-channel transistor $T_6$ and a N-channel transistor $T_7$. Reference $C_C$ designates a phase compensating capacitor used to avoid oscillation due to a negative feedback circuit.

Figure 1:
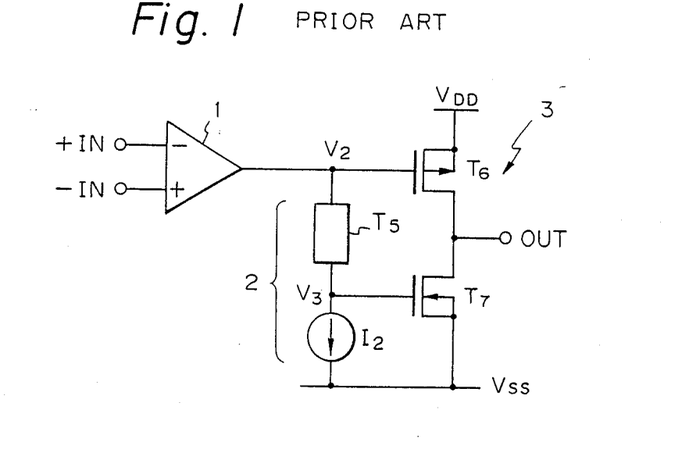
FIG. 1 is a circuit diagram illustrating a prior art operational amplifier circuit.
Figure 2:
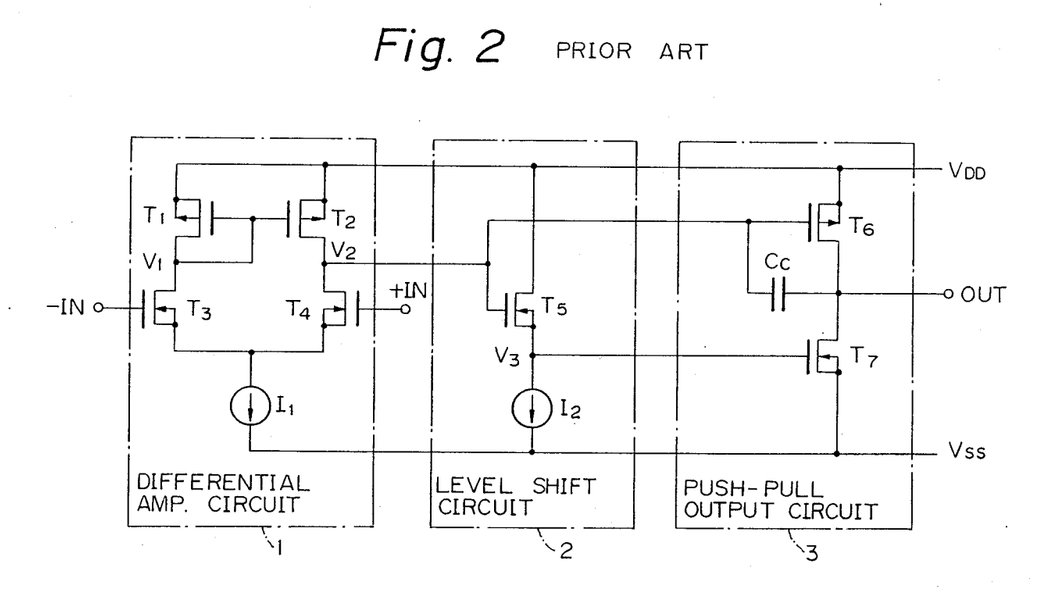
FIG. 2 is a detailed circuit diagram of the circuit of FIG. 1.

In the push-pull output circuit 3 of FIGS. 1 and 2, a current flowing through the transistor $T_6$ is determined by the difference between $V_{DD}$ and $V_2$, and a current flowing through the transistor $T_7$ is determined by the difference between $V_3$ and $V_{SS}$. In this case, since the current of the constant current source $I_2$ is constant, the value $(V_2-V_3)$ is constant. Here, $$V_{DD} - V_{SS} = (V_{DD} - V_2) + (V_2 - V_3) + (V_3 - V_{SS})$$

Therefor, if $(V_{DD}-V_{SS})$ is greatly fluctuated, the first term $(V_{DD}-V_2)$ and the third term $(V_3-V_{SS})$ are greatly fluctuated, since the second term $(V_2-V_3)$ is constant. The first term affects the conductivity of the P-channel transistor $T_6$ and the third term affects the conductivity of the N-channel transistor $T_7$, thus greatly affecting the operating point of the push-pull output circuit 3, which means that the output voltage at the terminal OUT of the push-pull output circuit 3 is greatly fluctuated. Also, if the operating point of the push-pull output circuit 3 is fluctuated, the supply current and the characteristics of the unity gain and the DC gain are also fluctuated.

In FIGS. 1 and 2, note that the fluctuation of the voltages $V_2$ and $V_3$ actually follows that of the power supply voltage $V_{DD}$, and therefore, the third term $(V_3 - V_{SS})$ is mainly fluctuated.

Figure 3:
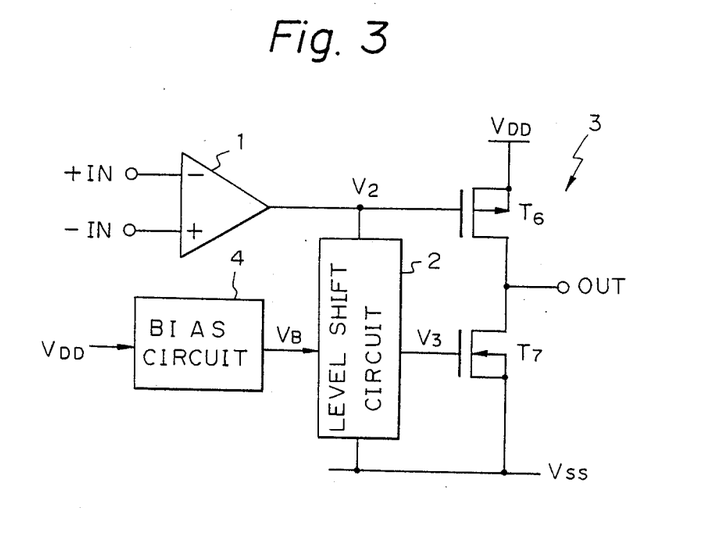
FIG. 3 is a circuit diagram illustrating a basic configuration of the operational amplifier circuit according to the present invention.

In FIG. 3 which illustrated a basic configuration of the operational amplifier circuit according to the present invention, a bias circuit 4 is added to the elements of FIG. 1, and the level shift circuit 2 is modified. Namely, the bias circuit 4 generates a bias voltage $V_B$ in accordance with the fluctuation of the power supply voltage $V_{DD}$ to control the level shift circuit 2, and thus the output voltage of the level shift circuit 2 is not changed even when the fluctuation of the power supply voltage $V_{DD}$ occurs. That is, the bias circuit 4 controls the level shift circuit 2 by the bias voltage $V_B$ having a fluctuation in accordance with the fluctuation of the power supply voltage $V_{DD}$.

In FIG. 3, the fluctuation of the power supply volta $V_{DD}$ does not affect the gate-to-source $(V_3 - V_{SS})$ of the transistor $T_7$ of the push-pull output circuit 3, and therefore, even if the power supply voltage $V_{DD}$ is fluctuated, the current flowing through the transistor $T_7$ is not fluctuated. Note that, since the output voltage $V_2$ of the differential amplifier circuit 1 follows the power supply voltage $V_{DD}$, the voltage $(V_{DD}-V_2)$ is not fluctuated even when the power supply voltage $V_{DD}$ is fluctuated, and therefore, the current flowing through the transistor $T_6$ is not fluctuated. Accordingly, the operating point of the push-pull output circuit 3 is not fluctuated by the fluctuation of the power supply voltage $V_{DD}$.

Figure 4:
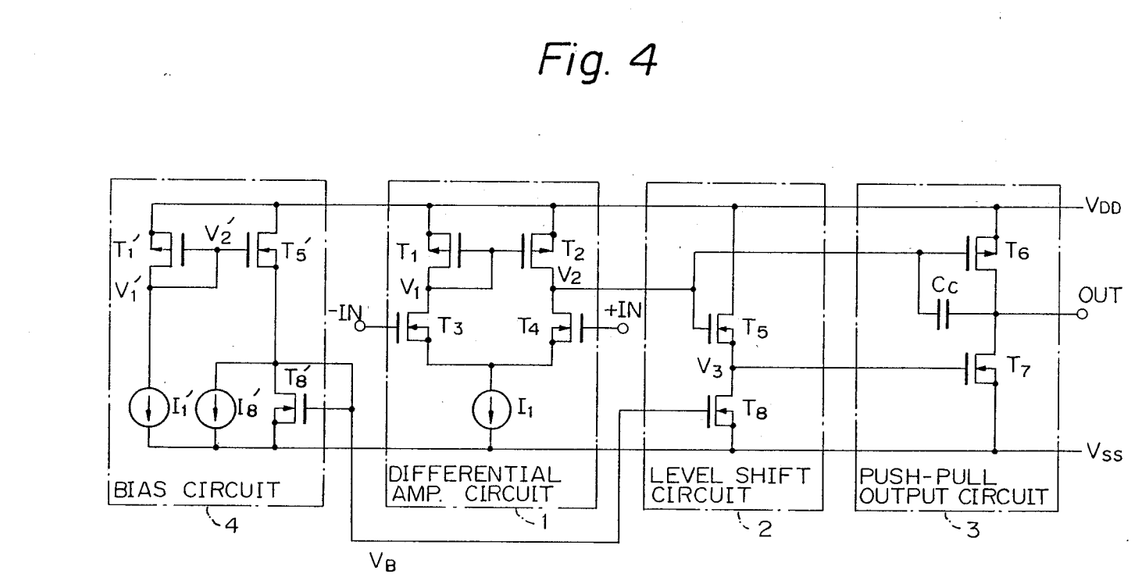
FIGS. 4, 6, and 8 are circuit diagrams illustrating first, second, and third embodiments, respectively, of the operational amplifier circuit according to the present invention.
Figure 6:
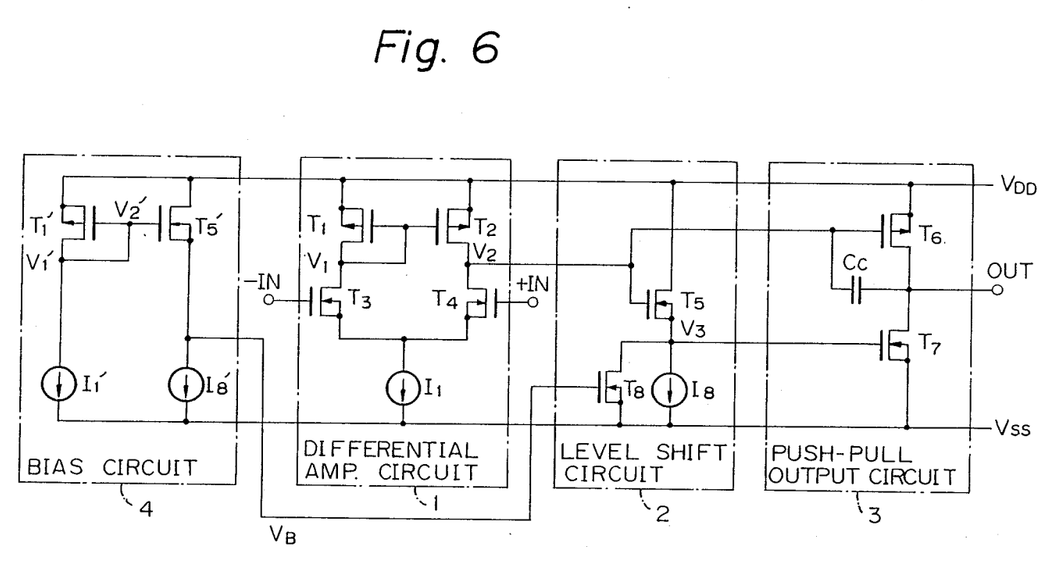
Figure 8:
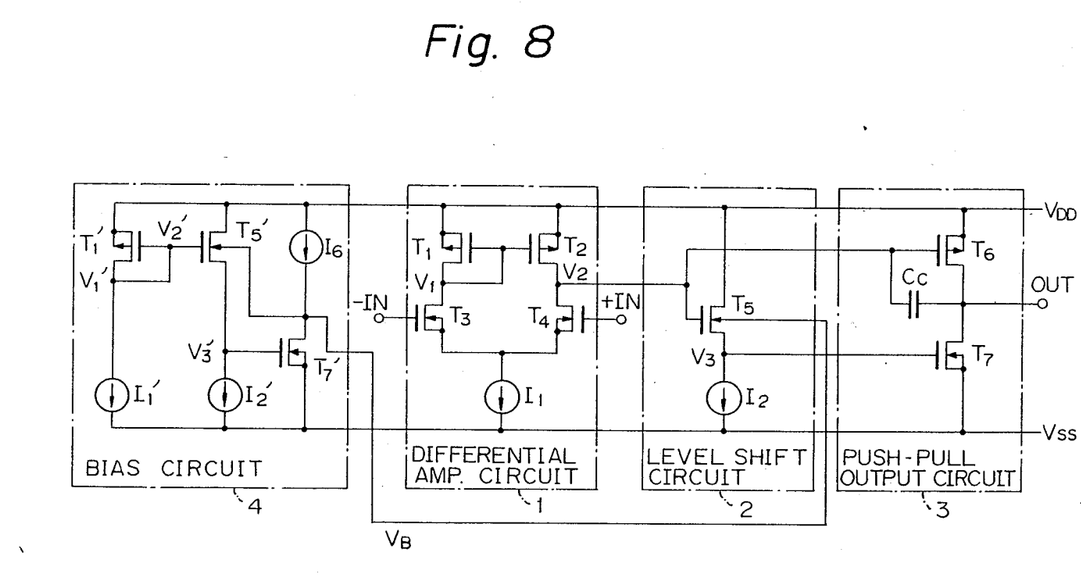

The circuit of FIG. 3 will be in detail with reference to the embodiments of FIG. 4, 6, and 8.

In FIG. 4, which illustrates a first embodiment of the present invention, the constant current source $I_2$ of the level shift circuit 2 of FIG. 2 is replaced by an N-channel transistor $T_8$ serving as a variable current source, and the gate thereof is controlled by the bias voltage $V_B$ of the bias circuit 4.

The parameters of the constituents of the bias circuit 4 are similar to those of the differential amplifier circuit 1 and the level shift circuit 2, i.e., the bias circuit 4 comprises a P-channel transistor $T_1$, corresponding to the P-channel transistor $T_1$ and $T_2$ of the differential amplifier circuit 1, a constant current source $I_{1'}$ corresponding to the constant current source $I_1$, an N-channel transistor $T_{5'}$ corresponding to the N-channel transistor $T_5$ of the level shift circuit 2, and a N-channel transistor $T_{8'}$ and a constant current source $T_{8'}$ corresponding to the N-channel transistor $T_8$.

The constituents of the bias circuit 4 are determined so that the fluctuation $\Delta V_3$ of the output voltage $V_3$ of the level shift circuit 2 is 0 even when a fluctuation $\Delta V_{DD}$ occurs in the power supply voltage $V_{DD}$. Here, $g_{mx}$ and $\beta_x$ are a mutual conductance and a constant determined by the size, respectively, of a transistor $T_x$ and $\Delta V_2$, $\Delta V_3$, $\Delta V_{2'}$, and $\Delta V_B$ are fluctuations of the voltages $V_2$, $V_3$, $V_{2'}$, and $V_B$, respectively, when a fluctuation $\Delta V_{DD}$ occurs in the power supply voltage $V_{DD}$. Accordingly, the fluctuation of a current through the transistor $T_8$ is represented by $g_{m8} \cdot \Delta V_B$, and therefore, in the transistors $T_5$ and $T_8$, $$\Delta V_3 = \Delta V_2 - \frac{g_{m8}}{g_{m5}} \cdot \Delta V_B \qquad (1)$$

Similarly, in the transistors $T_{5'}$ and $T_{8'}$ of the bias circuit 4, $$\Delta V_B = \frac{g_{m5'}}{g_{m5'} + g_{m8'}} \cdot \Delta V_{2'} \qquad (2)$$

On the other hand, due to the operation of the transistors $T_3$ and $T_4$ in a saturation state and the presence of the constant current source $I_1$.

$$\Delta V_2 = \Delta V_{DD} \qquad (3)$$

Also, due to the presence of the constant current source $I_{1'}$, $$\Delta V_{2'} = \Delta V_{DD} \qquad (4)$$

Therefore, from the formulae (1) to (4), $$\Delta V_3 = \Delta V_{DD} - \frac{g_{m8}}{g_{m5}} \cdot \frac{g_{m5'}}{g_{m5'} + g_{m8'}} \cdot \Delta V_{DD} = \qquad (5)$$

$$\left(1 - \frac{g_{m8}}{g_{m5}} \cdot \frac{g_{m5'}}{g_{m5'} + g_{m8'}}\right) \cdot \Delta V_{DD}$$

Here, even when a fluctuation $\Delta V_{DD}$ occurs in the power supply voltage $V_{DD}$, to reduce the fluctuation $\Delta V_3$ of the gate-to-source voltage $(V_3 - V_{SS})$ of the transistor $T_7$, is obtained, from the formula (5), $$g_{m8'} = \left(\frac{g_{m8}}{g_{m5}} - 1\right) \cdot g_{m5'} \qquad (6)$$

Note that $V_{SS}$ is the ground level, and therefore, no fluctuation occurs in $V_{SS}$. Here, the constituents of the bias circuit 4 are balanced with those of the differential amplifier circuit 1 and the level shift circuit 2. Therefore, $$\begin{aligned} I_{1'}:I_1/2 &= \beta_{1'}:\beta_2 \\ &= \beta_{5'}:\beta_5 \\ &= (I_{8'} + I_{T8'}):I_{T8} \end{aligned}$$

where $I_{T8'}$ and $I_{T8}$ are drain-to-source currents flowing through the transistors $T_{8'}$ and $T_8$, respectively, Therefore, the formula (6) is $$g_{m5'} = \frac{\beta_{5'}}{\beta_5} \cdot g_{m5} = \frac{2 \cdot I_{1'}}{I_1} g_{m5}$$

Thus, $$g_{m8}' = \left( \frac{g_{m8}}{g_{m5}} - 1 \right) \cdot \frac{2 \cdot I_1'}{I_1} \cdot g_{m5}$$

$$= (g_{m8} - g_{m5}) \cdot \frac{2 \cdot I_1'}{I_1}$$

$$= \left( 1 - \frac{g_{m5}}{g_{m8}} \right) \cdot \frac{2 \cdot I_1'}{I_1} \cdot g_{m8}$$

Generally, in a MOS transistor, $$g_m = \frac{\partial I_D}{\partial V_{GS}}$$

$$= \frac{\partial}{\partial V_{GS}} \frac{\beta}{2} (V_{GS} - V_{th})^2$$

$$= \beta(V_{GS} - V_{th})$$

$$= \sqrt{2\beta I_D}$$

where $I_D$ is a drain-to-source current;
$V_{GS}$ is a gate-to-source voltage; and
$V_{th}$ is a threshold voltage. Here, in the transistors $T_5$ and $T_8$, the drain-to-source current $I_D$ is the same, and in the transistors $T_8$ and $T_8'$, $V_{GS}$ is the same. Therefore, the formula (7) is $$\beta_8' = \left( 1 - \sqrt{\frac{\beta_5}{\beta_8}} \right) \cdot \beta_8 \cdot \frac{2 \cdot I_1'}{I_1} \qquad (8)$$

Figure 5A:
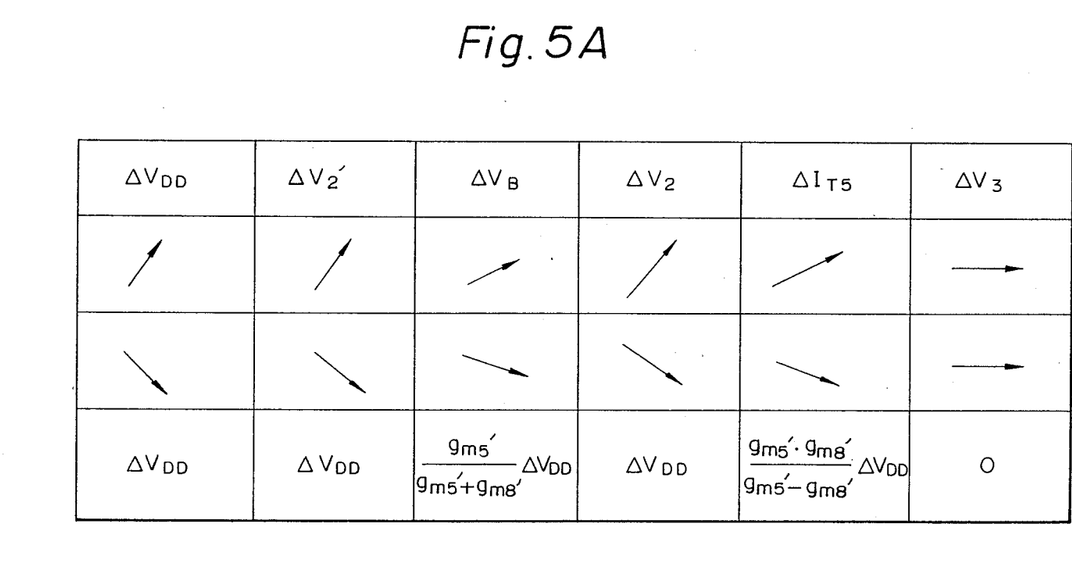
FIG. 5A is a diagram showing the voltages in the circuit of FIG. 4.
Figure 5B:
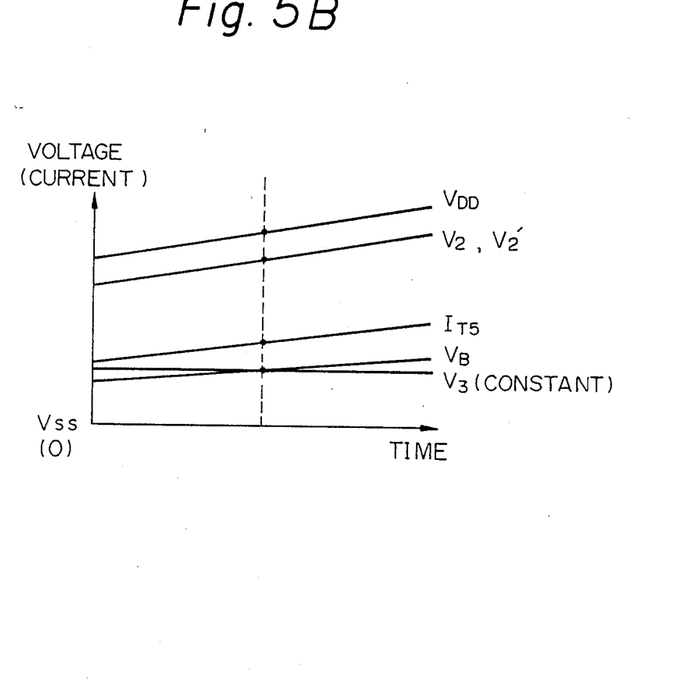
FIG. 5B is a timing diagram showing the operation of the circuit of FIG. 4.

Here, the gate length and width of a transistor $T_X$ are represented by $L_X$ and $W_X$, respectively. Then, if $L_2=L_2'$, $L_5=L_5'$ and $L_8=L_8'$, $$W_2' = \frac{2 \cdot I_1'}{I_1} \cdot W_2$$

$$W_5' = \frac{2 \cdot I_1'}{I_1} \cdot W_5$$

$$W_8' = \frac{2 \cdot I_{11}}{I_1} \cdot \left( 1 - \sqrt{\frac{W_5/L_5}{W_8/L_8}} \right) \cdot W_8$$

$$I_8' = \frac{2 \cdot I_1'}{I_1} \cdot T_8 - I_{T8}'$$

then $\Delta V_3=0$. In summary, each of the voltages of the circuit of FIG. 4 is charged with respect to the changed $\Delta V_{DD}$, as illustrated in FIGS. 5A and 5B.

In FIG. 6, which illustrates a second embodiment of the present invention, the transistor $T_8'$ of the bias circuit 4 of FIG. 4 is replaced by a constant current source $I_8$ provided in the level shift circuit 2. Also in FIG. 6 in the same way as in the embodiment of FIG. 4, the elements $T_5$, $T_8$, and $I_8$ of the level shift circuit 2 are determined so that $\Delta V_3=0$ with respect to the change $\Delta V_{DD}$. Namely, in this case, in the bias circuit 4, the fluctuation $\Delta V_B$ of the output voltage $V_B$ follows the fluctuation $\Delta V_{DD}$ of the power supply voltage $V_{DD}$, therefore, $$\Delta V_B = \Delta V_{DD}$$

Therefore, in the transistors $T_5$ and $T_8$, $$\Delta V_3 = \Delta V_{DD} - \frac{g_{m8}}{g_{m5}} \cdot \Delta V_{DD}$$

Therefore, to obtain $\Delta V_3=0$, $$g_{m5} = g_{m8}$$

Accordingly, in the level shift circuit 2, $$\beta_5 \cdot I_{T5} = \beta_8 \cdot I_{T8} = \beta_8(I_{T5} - I_8) \qquad (9)$$

$$\therefore \frac{\beta_5}{\beta_8} = 1 - \frac{I_8}{I_{T5}}$$

Figure 7A:
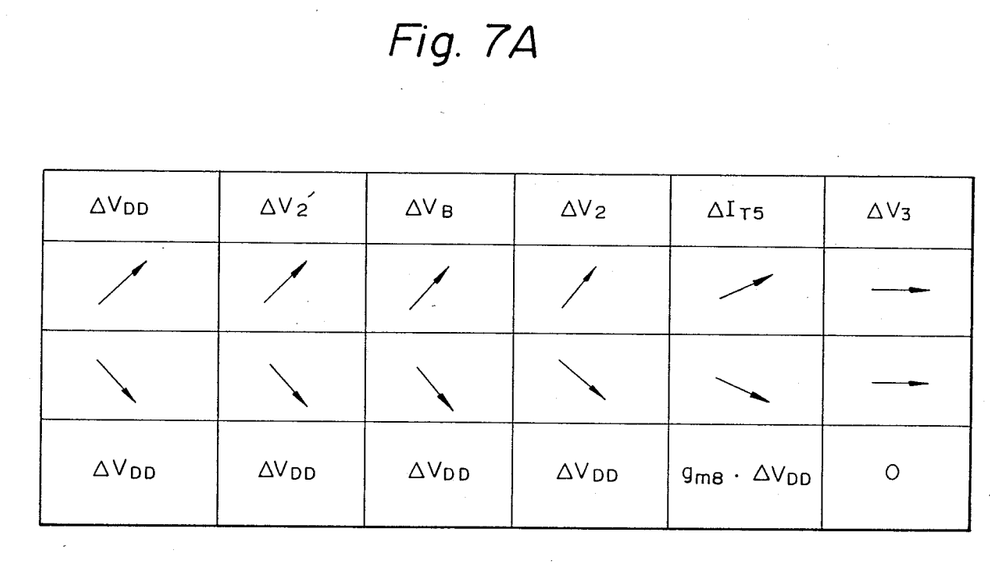
FIG. 7A is a diagram showing the voltages in the circuit of FIG. 8.
Figure 7B:
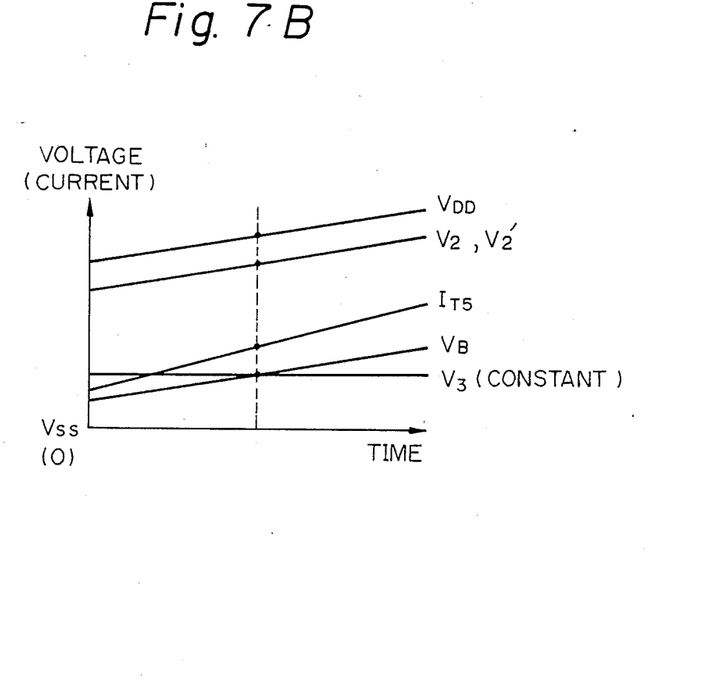
FIG. 7B is a timing diagram showing the operation of the circuit of FIG. 6.

From the formula (9) and the condition that a potential shift of a voltage $(V_2-V_3)$ is carried out where a current $I_{T5}$ is supplied to the transistor $T_5$, the transistors $T_5$, $T_8$, and the constant current source $I_8$ can be determined. In summary, the voltages of the circuit of FIG. 6 are changed with respect to the change $\Delta V_{DD}$, as illustrated in FIGS. 7A and 7B.

In FIG. 8, which illustrates a third embodiment of the present invention, the threshold voltage of the N-channel transistor $T_5$ as a constant voltage element is varied by changing the substrate potential due to the back bias effect. That is, in a CMOS circuit, usually an N-channel transistor is formed within a P-conductivity type well, and accordingly, the threshold voltage of the N-channel transistor $T_5$ can be changed by changing the potential of the P-conductivity type well, and thus the voltage $(V_2-V_3)$ can be varied.

The substrate potential of the transistor $T_5$ is controlled by the output volt of the bias circuit 4, The transistor $T_1'$ and the constant current source $I_1'$ correspond to the transistors $T_1$, $T_2$ and the constant current source $I_1$ of the differential amplifier circuit 1. Therefore, $$I_1':I_1/2 = T_1':T_2$$

Also, the transistor $T_{5'}$ and the constant current source $I_2'$ correspond to the transistor $T_5$ and the constant current source $I_2$ of the level shift circuit 2. Therefore, $$T_5':T_5 = I_2':I_2$$

Further, the operating point of the transistor $T_7$ is $$I_6 \cdot \frac{\beta_7}{\beta_7'}.$$

Figure 9A:
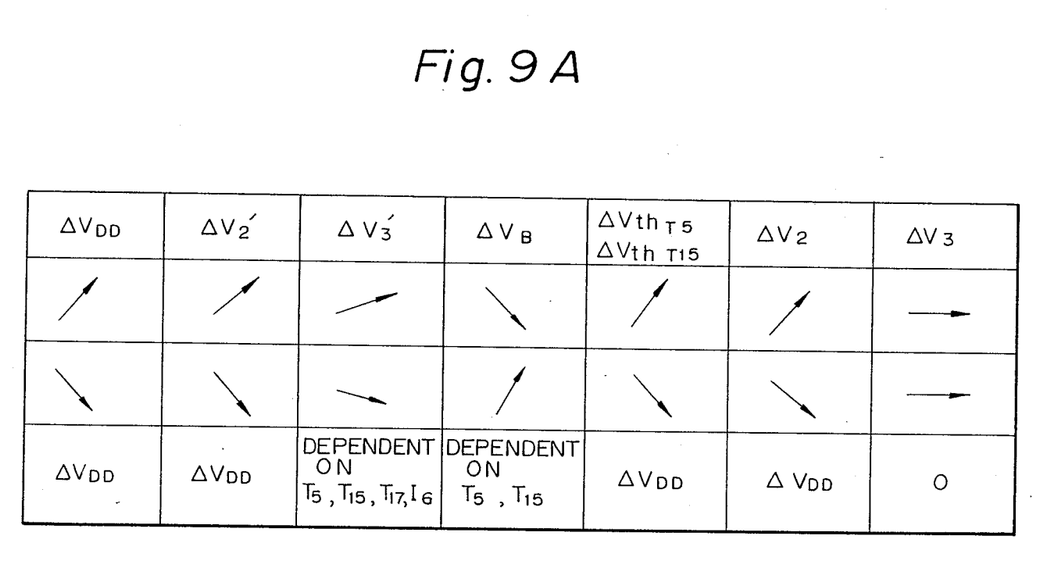
FIG. 9A is a diagram showing the voltages in the circuit of FIG. 8.
Figure 9B:
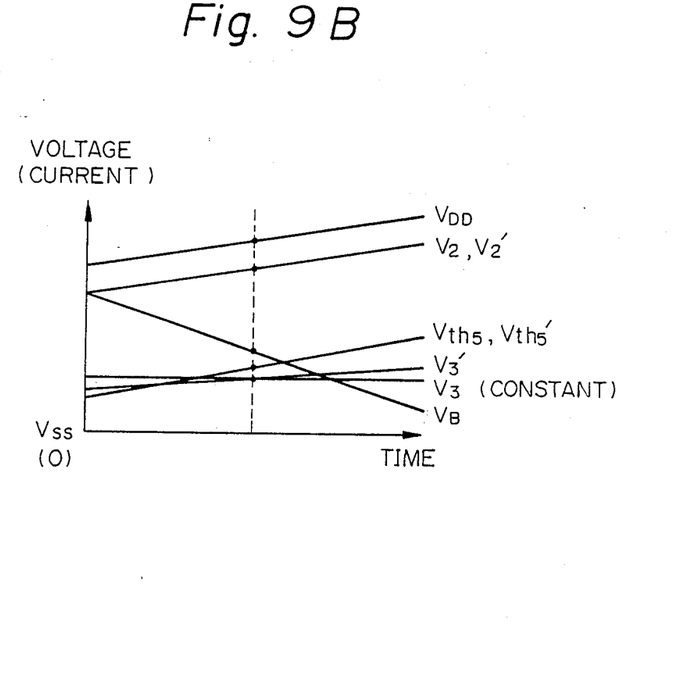
FIG. 9B is a timing diagram showing the operation of the circuit of FIG. 8.

In FIG. 8, when the power supply voltage $V_{DD}$ is changed by $\Delta V_{DD}$, the voltages $V_2$ and $V_2$, are also changed by $\Delta V_{DD}$. Further, the voltages $V_3$ and $V_3'$ have the same tendency to change. In this case, if $\Delta V_{DD}>0$, the currents through the transistors $T_7$ and $T_7'$ tend to increase, and as a result, the back bias potential of $V_b$ of the transistors $T_5'$ and $T_5$ is reduced. Therefore, the threshold voltages of the transistors $T_5'$ and $T_5$ are increased to suppress the increase of the voltages $V_3$ and $V_3'$. Similarly, if $\Delta V_{DD}<0$, the currents of the transistors $T_7$ and $T_7'$ tend to decrease, and as a result, the back bias potential $V_B$ of the transistors $T_5'$ and $T_5$ is increased. Therefore, the threshold voltages of the transistors $T_5'$ $T_5$ is decreased to suppress the decrease of the voltages $V_3$ and $V_3'$. Therefore, even when a fluctuation $\Delta V_{DD}$ occurs in the power supply voltage $V_{DD}$, the fluctuation $\Delta V_3$ of the voltage $V_3$ can be 0. In summary, the voltages are changed with respect to the change as $\Delta V_{DD}$ illustrated in FIGS. 9A and 9B.

In the above-mentioned embodiments, since the transistors and constant current sources of the bias circuit have a configuration similar to that of the differential amplifier circuit and level shift circuit of the operational amplifier circuit, the bias condition of the bias circuit is the same as that of the operational amplifier circuit, and thus the operating point can be stabilized with respect to the parameter fluctuation of the transistors.

As explained above, according to the present invention, the operating point can be stabilized even when fluctuations occur in the power supply voltage, and as a result, the fluctuation of the power current, the fluctuation of the unity gain frequency characteristics, and the fluctuation of the DC gain characteristics are reduced with respect to the change of the power supply voltage. Also, the characteristic of a threshold voltage of a transistor with respect to the fluctuations of constants thereof can be stabilized simultaneously with the suppression of the fluctuation of the characteristics with respect to the fluctuation of the characteristics of the power supply voltage. Note, according to results of the inventors' experiments, the fluctuation of the power current is reduced by about $\frac{1}{4}$; the fluctuation of the unit gain frequency characteristics is reduced by about $\frac{1}{2}$; and the fluctuation of the DC gain characteristics as reduced by about $\frac{1}{3}$, compared with the prior art circuit of FIGS. 1 and 2.

We claim:

1. An operational amplifier circuit, comprising:
   first and second power supply terminal means;
   a differential amplifier circuit means, connected between said first and second power supply terminal means, for generating an output voltage in response to a difference in potential between two input signals, said output voltage varying in response to fluctuations of a power supply voltage;
   a level shift circuit means, connected to said first and second power supply terminal means, and to said differential amplifier circuit for shifting the output voltage of said differential amplifier circuit by a level shift amount dependent on said power supply voltage to generate another output voltage;
   a push-pull output circuit means, connected to said first and second power supply terminal means, to said differential amplifier circuit, and to said level shift circuit, said push-pull output circuit means being for operating in response to an output voltage of said differential amplifier circuit means and an output voltage of said level shift circuit means; and
   a bias circuit means, connected to said first and second power supply terminal means and to said level shift circuit, for generating a bias voltage which varies in response to fluctuations of said power supply voltage for changing said level shift amount of said level shift circuit means, to prevent the another output voltage of said level shift circuit means from being affected by any fluctuations of said power supply voltage.

2. A circuit as set forth in claim 1, wherein said level shift circuit means comprises:
   a transistor having a conductance, connected to said power supply terminal means and said differential amplifier circuit means, for reducing the output voltage thereof by said predetermined value; and
   a variable current source, connected between said transistor and said second power supply terminal means, and to said bias circuit means, the current of said variable current source being controlled by the bias voltage of said bias circuit means.

3. A circuit as set forth in claim 2, wherein said bias circuit means comprises:
   a first transistor connected to said first power supply terminal means, said first transistor having the same configuration as a corresponding element of said differential amplifier circuit;
   a first constant current source connected between said first transistor and said second power supply terminal means, said first constant current source having the same configuration as a corresponding element of said differential amplifier circuit;
   a second transistor connected to said first power supply terminal means, said second transistor having the same configuration as said transistor of said level shift circuit;
   a second constant current source connected between said second transistor and said second power supply terminal means, a node between said second transistor and said second constant current source being an output terminal for the bias voltage; and
   a third transistor connected between said second transistor and said second power supply terminal means, said third transistor being controlled by the bias voltage,
   said second constant current source and said third transistor corresponding to said variable current source of said level shift circuit,
   said second and third transistors, and said transistor and said variable current source of said level shift circuit satisfying the condition:

$$g_{m8}' = \left( \frac{g_{m8}}{g_{m5}} - 1 \right) \cdot g_{m5}'$$

where $g_{m5}$, $g_{m8}$, $g_{m5}'$, and $g_{m8}'$ are mutual conductances of said second and third transistors, said transistor and said variable current source of said level shift circuit, respectively.

4. A circuit as set forth in claim 2, wherein said level shift circuit means further comprises a constant current source having a conductance connected in parallel with said variable current source.

5. A circuit as set forth in claim 4, wherein said bias circuit means comprises:
   a first transistor connected to said first power supply terminal means, said first transistor having the same configuration as a corresponding element of said differential amplifier circuit;
   a first constant current source connected between said first transistor and said second power supply terminal means, said first constant current source having the same configuration as a corresponding element of said differential amplifier circuit;
   a second transistor connected to said first power supply terminal means, said second transistor having the same configuration as said transistor of said level shift circuit; and
   a second constant current source connected between said second transistor and said second power supply terminal means, a node between said second transistor and said second constant current source being an output terminal for the bias voltage, said second constant current source corresponding to said variable current source and said constant current source of said level shift circuit, the mutual conductances of said transistor and said constant current source of said level shift circuit being the same.

6. A circuit as set forth in claim 1, wherein level shift circuit means comprises:

a transistor having a substrate potential, connected to said power supply terminal means and said differential amplifier circuit means, for reducing the output voltage thereof by said predetermined value; and a constant current source, connected between said transistor and said second power supply terminal means, the substrate potential of said transistor being controlled by the bias voltage of said bias circuit means.

7. A circuit as set forth in claim 6, wherein said bias circuit means comprises:

a first transistor connected to said first power supply terminal means, said first transistor having the same configuration as a corresponding element of said differential amplifier circuit;

a first constant current source connected between said first transistor and said second power supply terminal means, said first constant current source having the same configuration as a corresponding element of said differential amplifier circuit;

a second transistor connected to said first power supply terminal means, said second transistor having the same configuration as said transistor of said level shift circuit;

a second constant current source connected between said second transistor and said second power supply terminal means;

a third constant current source connected between said first power supply terminal means, said third constant current source having the same configuration as a corresponding element of said push-pull output circuit; and a third transistor connected between said third constant current source and said second power supply means, and to a node between said second transistor and said second constant current source, said third transistor being controlled by the potential at said node, the substrate potential of said second transistor being controlled by the bias voltage of said bias circuit.

8. A circuit as set forth in claim 1, wherein said differential amplifier circuit means comprises:

first and second transistor connected to said first power supply terminal means, said first and second transistors forming a current mirror circuit;

a third transistor connected to said first transistor, said third transistor being controlled by one of said input signals;

a fourth transistor connected to said second transistor, said fourth transistor being controlled by the other of said input signals; and a constant current source, connected to said third and fourth transistors and to said second power supply terminal means.

9. A circuit as set forth in claim 1, wherein said push-pull output circuit comprises:

a first transistor connected to said first power supply terminal means and said differential amplifier circuit, said first transistor being controlled by the output voltage of said differential amplifier circuit; and a second transistor connected to said first transistor, said second power supply terminal means and to said level shift circuit, said second transistor being controlled by the output voltage of said level shift circuit.

10. An operational amplifier circuit, comprising:

first and second power supply terminal means;

a differential amplifier circuit means, connected between said first and second power supply terminal means, for generating an output voltage in response to a difference in potential between two input signals;

a level shift circuit means, Connected to said first and second power supply terminal means, and to said differential amplifier circuit, for shifting the output voltage of said differential amplifier circuit by a predetermined value to generate another output voltage, wherein said level shift circuit means further comprises a constant current source having a conductance connected in parallel with said variable current source;

a push-pull output circuit means, connected to said first and second power supply terminal means, to said differential amplifier circuit, and to said level shift circuit, said push-pull output circuit means being for operating in response to an output voltage of said differential amplifier circuit means and an output voltage of said level shift circuit means; and a bias circuit means, connected to said first and second power supply terminal means and to said level shift circuit, for generating a bias voltage in response to said power supply voltage for controlling said level shift circuit means to thereby prevent the another output voltage of said level shift circuit means from being affected by any fluctuations of said power supply voltage, wherein said level shift circuit means comprises:

a transducer having a conductance, connected to said power supply terminal means and said differential amplifier circuit means, for reducing the output voltage thereof by said predetermined value; and a variable current source, connected between said transistor and said second power supply terminal means, and to said bias circuit means, the current of said variable current source being controlled by the bias voltage of said bias circuit.

* * * * *